United States Patent
Watanabe et al.

(10) Patent No.: US 6,260,417 B1
(45) Date of Patent: Jul. 17, 2001

(54) SEMICONDUCTOR PRESSURE SENSOR DEVICE WITH MULTI-LAYERED PROTECTIVE MEMBER THAT REDUCES VOID FORMATION

(75) Inventors: Yoshifumi Watanabe, Kariya; Takashi Aoki, Toyoake; Hiroyuki Okada, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/417,301

(22) Filed: Oct. 13, 1999

(51) Int. Cl.[7] ................................. G01L 9/00; G01L 9/16
(52) U.S. Cl. ............................................................ 73/754
(58) Field of Search .............................. 73/706, 715–727, 73/754, 35.12; 338/4, 42, 226, 252, 253

(56) References Cited

U.S. PATENT DOCUMENTS 4,732,042 * 3/1988 Adams ...................................... 73/754
5,357,673 10/1994 Polak ....................................... 29/840
5,877,425 * 3/1999 Suzuki et al. ............................ 73/727

FOREIGN PATENT DOCUMENTS

| 5-145085 | 6/1993 | (JP) . |
| 10-170381 | 6/1998 | (JP) . |
| 11-241970 | 9/1999 | (JP) . |
| 11-304619 | 11/1999 | (JP) . |

* cited by examiner

*Primary Examiner*—William Oen
(74) *Attorney, Agent, or Firm*—Pillsbury Winthrop LLP

(57) ABSTRACT

A semiconductor pressure sensor chip is mounted on a recess of a resin package, and is electrically connected to bonding pads on the bottom of the recess through bonding wires. The recess is filled with a first protective member having a relatively large Young's modulus and a second protective member having a relatively small Young's modulus. The first protective member covers the bonding pads, and the second protective member is disposed on the first protective member and covers a diaphragm of the sensor chip. Accordingly, voids are prevented from being produced without preventing displacement of the diaphragm.

14 Claims, 1 Drawing Sheet

Figure 1:
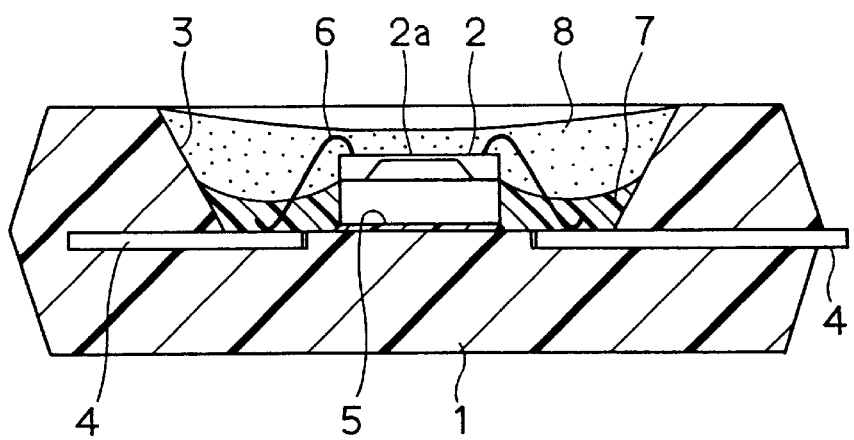
Figure 2:
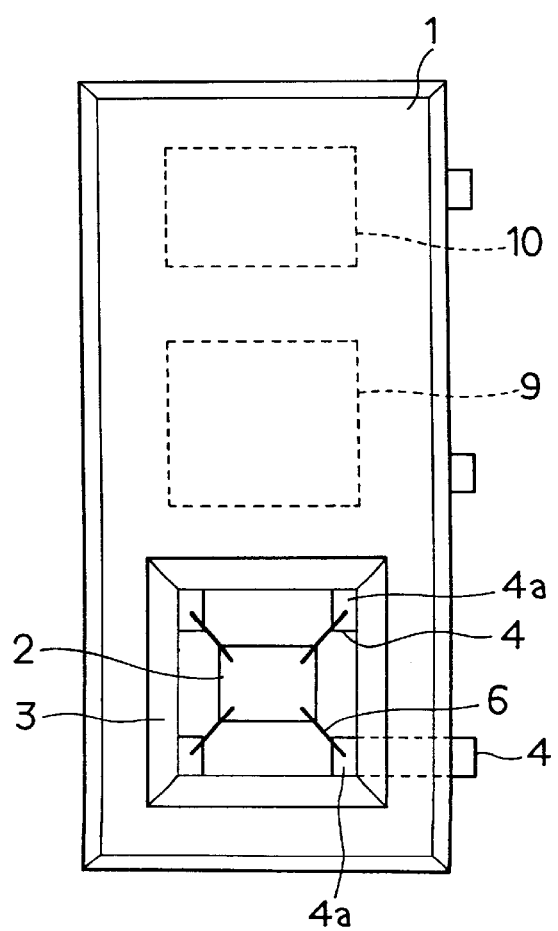

SEMICONDUCTOR PRESSURE SENSOR DEVICE WITH MULTI-LAYERED PROTECTIVE MEMBER THAT REDUCES VOID FORMATION

CROSS REFERENCE TO RELATED APPLICATION

This application is based upon Japanese Patent Application No. 10-115211, filed on Apr. 24, 1998.

BACKGROUND OF THE INVENTION

1. Field of the Invention

This invention relates to a semiconductor pressure sensor device including a semiconductor pressure sensor chip mounted on a resin package for detecting a negative pressure.

2. Description of the Related Art

Generally, a semiconductor pressure sensor chip utilizing a piezoresistance effect is adopted as a pressure detecting element to a pressure sensor device for detecting an intake pressure of an automotive engine. This kind of pressure sensor chip includes several diffusion resistors. The diffusion resistors are disposed on a diaphragm made of a material (for instance, single crystal silicon) capable of providing the piezoresistance effect, and are connected into a bridge circuit. A pressure signal is taken out from the bridge circuit in accordance with changes in resistance values of the diffusion resistors which are caused by displacement of the diaphragm.

The pressure sensor chip is conventionally mounted on a resin package. For instance, the sensor chip is disposed on a sensor mount part of the resin package through adhesive by die bonding, and is electrically connected to a conductive part through conductive wires. The conductive part is formed at the resin package side by insert-molding. The pressure sensor chip and the bonding wires are covered with a protective member made of an insulating material to protect them from corrosion, and to secure those insulating performance. In this case, a gel-like insulating material is generally used as the protective member not to inhibit the displacement of the diaphragm.

The covering step by the protective member is carried out under a vacuum atmosphere to prevent voids from being produced in the protective member and within a region covered by the protective member. However, it is very difficult to completely remove air existing in a gap produced between the resin package and the conductive part formed by insert-molding. In addition, the surface of the conductive part is usually plated with gold having low affinity. This results in low adhesiveness between the gel-like protective member and the surface of the conductive part, thereby allowing a state where air is trapped at the interface part.

Because of this, when the semiconductor pressure sensor device detects a negative pressure such as an engine intake pressure, voids produced by air described above within the gel-like protective member grow. The grown voids may move within the gel-like protective member to cause deterioration of the insulating performance and breakage of the wire bonding.

When the semiconductor pressure sensor chip is mounted on a ceramic package by utilizing a wire-bonding technique as disclosed in U.S. Pat. No. 5,357,673, generation of voids can be suppressed as compared to the case adopting the resin package case described above. However, the ceramic package also necessitates bonding pad parts, and therefore, it is difficult to prevent voids from being produced at the interface between the bonding pad parts and the protective member. In addition, since the ceramic package is composed of several members, a number of parts is increased.

SUMMARY OF THE INVENTION

The present invention has been made in view of the above problems. An object of the present invention is to provide a semiconductor pressure sensor device for detecting a negative pressure with improved operational reliability by preventing voids from being produced within a protective member covering a semiconductor pressure sensor.

According to the present invention, a semiconductor pressure sensor device has a sensor chip mounted on a resin package and electrically connected to a conductive part on the resin package, a first protective member covering a portion including an entire surface of the conductive part and excluding a sensing part of the sensor chip, and a second protective member covering the first protective member and the sensing part. The first protective member has a Young's modulus larger than that of the second protective member.

Accordingly, even when air is trapped in a gap produced between the resin package and the conductive part and at an interface between the first protective member and the conductive part, since the first protective member having a relatively large Young's modulus covers the conductive part, voids are prevented from being produced by air described above. Further, since the sensing part of the sensor chip is covered with the second protective member having a relatively small Young's modulus, a preferable insulating performance can be provided without deteriorating the sensing performance of the sensor chip.

BRIEF DESCRIPTION OF THE DRAWINGS

Other objects and features of the present invention will become more readily apparent from a better understanding of the preferred embodiments described below with reference to the following drawings, in which:

FIG. 1 is a cross-sectional view showing a semiconductor pressure sensor device in a preferred embodiment according to the present invention; and FIG. 2 is a plan view showing the semiconductor pressure sensor device.

DETAILED DESCRIPTION OF THE PREFERRED EMBODIMENT

The present invention is applied to a pressure sensor device for detecting an intake pressure of an automotive engine in a preferred embodiment. Referring to FIGS. 1 and 2, the pressure sensor device has a resin package 1 made of epoxy resin including fillers. The resin package 1 has a recess 3 for mounting a semiconductor pressure sensor chip 2 thereon.

Several insert pins (conductive parts) 4 made of a conductive material such as copper are integrally formed with the resin package 1 by insert-molding. The insert pins 4 includes specific four insert pins exposed at the four corners of the bottom face of the recess 3. The exposed portions of the insert pins 4 are plated with gold, and serve as bonding pads 4*a* (see FIG. 2). The semiconductor pressure sensor chip 2 has a well-known structure utilizing a piezoresistance effect. A diaphragm 2*a* as a sensing part and diffusion resistors not shown are provided on the upper surface of the sensor chip 2. The sensor chip 2 is die-bonded on the bottom face of the recess 3 through phlorosilicone based adhesive 5, and is electrically connected to the bonding pads 4a of the insert pins 4 through bonding wires 6. Two insulating layers composed of a first protective member 7 and a second protective member 8 fill the recess 3 to protect the sensor chip 2 and the bonding wires 6 and to secure the insulating performance and anti-corrosion performance.

Specifically, the first protective member 7 provided as a lower layer is made of fluorine based or phlorosilicone based resin material or rubber material having a relatively large Young's modulus. For instance, the Young's modulus is larger than approximately 0.1 MPa, and more preferably, larger than approximately 0.3 MPa. In this case, it is difficult to perform a penetration measurement because the material is relatively hard. The first protective member 7 covers the exposed portions of the insert pins 4 and those vicinities within the recess 3, the lower side part of the sensor chip 2 including the adhesive 5 as a mount part to the resin package 1, and a second bonding point side (the bonding pad side) of the bonding wires 6. The diaphragm 2a of the sensor chip 2 is not covered with the first protective member 7.

The second protective member 8 provided as an upper layer is made of fluorine based or phlorosilicone based gel having a relatively low Young's modulus. In this case, it is difficult to measure an accurate Young's modulus because the material is soft. For instance, its penetration is larger than approximately 10, and more preferably, larger than approximately 40. The second protective member 8 covers the first protective member 7, the upper side part of the sensor chip 2 including the diaphragm 2a, and a first bond point side (sensor chip side) of the bonding wires 6. The step for filling the recess 3 with the first protective member 7 and the second protective member 8 is carried out in a vacuum atmosphere.

The semiconductor pressure sensor device described above is accommodated in a housing not shown, and is disposed in a state where the recess 3 communicates with an intake passage of the automotive engine. Accordingly, the sensor chip 2 can detect the negative pressure. An amplifier circuit 9 for amplifying an output signal from the sensor chip 2 and a trimming circuit 10 for controlling a circuit constant such as an amplification factor of the amplifier circuit 9 are disposed in the resin package 1. The sensor chip 2 and the amplifier circuit 9 are electrically connected with each other via a lead frame not shown.

In the structure described above, there is a case where air is trapped in a gap produced between the resin package 1 and the insert pins 4 by resin contraction that occurs after the insert-molding. Further, since the bonding pads 4a are plated with gold, the adhesiveness between the surfaces of the bonding pads 4a and the first protective member 7 is low. Because of this, there is a case where air is trapped at the interface part between the bonding pads 4a and the first protective member 7.

However, according to the present embodiment, since the first protective member 7 covering the gap and the interface part described above is made of the material having a relatively large Young's modulus, occurrence of voids from the gap and the interface part can be effectively prevented when the sensor chip 2 detects the negative pressure. Further, since the adhesive 5 as the mount part of the sensor chip 2 to the resin package 1 is covered with the first protective member 7, voids are not produced from the adhesive 5.

This effect by the first protective member 7 is explained in more detail. This effect is achieved by considering a relationship among a pressure of gas (air) filling the gap, which can produce voids, a tensile strength and a tensile adhesive strength of the first protective member 7. The pressure of gas is calculated by an equation of PV=nRT, in which P is the pressure of gas, V is a volume of the gap, n is a molar quantity, R is a gas constant, and T is a temperature. The pressure P of gas filling the gap becomes a maximum pressure $P_0$ when a negative pressure $P_m$ is applied to the sensor chip 2. The maximum pressure $P_0$ is represented by a formula of $P_0=P+P_m$. Conditions required for the first protective member 7 are $F1 \geq P_0$, and $F2 \geq P_0$, in which F1 is the tensile strength and F2 is the tensile adhesive strength of the first protective member 7. Accordingly, since the tensile strength and the tensile adhesive strength of the first protective member 7 are larger than the pressure when the negative pressure is applied, generation of voids can be suppressed. Because of this, the first protective member 7 is made of a material having a relatively large Young's modulus, i.e., a relatively small elastic modulus. The first protective member 7 may be made of adhesive having a low elastic modulus in addition to the resin material and rubber material described above.

Accordingly, voids capable of deteriorating the insulating performances of the first protective member 7 and the second protective member 8 and causing breakage of the bonding wires 6 are hardly produced, resulting in improved operation reliability. Further, since the resin package 1 is used to mount the sensor chip 2, forming the recess 3 does not result in an increased number of the parts. The effects described above can be provided with a simple structure. Since the first protective member 7 is disposed to expose the diaphragm 2a as the sensing part and the diaphragm 2a is covered with the second protective member 8 made of a gel having a relatively low Young's modulus, a sufficient insulating performance can be provided without preventing the sensing performance of the diaphragm 2.

Both the material forming the first protective member 7 and the material forming the second protective member 8 as described above have sufficient resistance to gasoline, gas oil, and the like. Therefore, the pressure sensor device can be used without causing any problems under a condition where it is exposed to gasoline or gas oil for detecting the intake pressure of the engine.

While the present invention has been shown and described with reference to the foregoing preferred embodiment, it will be apparent to those skilled in the art that changes in form and detail may be made therein without departing from the scope of the invention as defined in the appended claims.

For instance, the semiconductor pressure sensor chip is not limited to the diaphragm type utilizing a piezoresistance effect, and it may be other types such as an electrostatic capacity type. Although the resin package 1 is formed with the recess 3 for mounting the sensor chip 2, it is not always necessary to form the recess 3. It is sufficient for the first protective member 7 to cover at least the insert pins 4, and those vicinities. The amplifier circuit 9 and the trimming circuit 10 may be integrated as a monolithic IC with respect to the sensor chip 2. A third protective member may be interposed between the first protective member 7 and the second protective member 8 with a hardness between those of the members 7 and 8.

What is claimed is:

1. A semiconductor pressure sensor device for detecting a negative pressure, comprising:
   a resin package;
   a conductive member integrally formed with the resin package by insert molding to have a conductive part exposed from the resin package;

a sensor chip mounted on the resin package and electrically connected to the conductive part, the sensor chip having a sensing part for detecting a negative pressure;

a first protective member covering a portion including an entire surface of the conductive part and excluding the sensing part of the sensor chip; and a second protective member covering the first protective member and the sensing part, wherein the first protective member has a Young's modulus larger than a Young's modulus of the second protective member.

2. The semiconductor pressure sensor device of claim 1, further comprising a bonding wire connecting the sensor chip and the conductive part and covered with the first protective member and the second protective member.

3. The semiconductor pressure sensor device of claim 1, wherein:

the sensor chip is mounted on the package at a mount part thereof at a side opposite to the sensing part; and the mount part is covered with the first protective member.

4. The semiconductor pressure sensor device of claim 1, wherein:

the first protective member is made of one selected from a group consisting of a fluorine based resin material, a phlorosilicone based resin material, and a rubber material; and the second protective member is made of one selected from a group consisting of a fluorine based gel and a phlorosilicone based gel.

5. The semiconductor pressure sensor device of claim 1, wherein the resin package has a recess for mounting the sensor chip.

6. The semiconductor pressure sensor device of claim 1, wherein the first protective member has a tensile strength F1 and a tensile adhesive strength F2 which are represented by:

$$F1 \geq P+P_m; \text{ and}$$

$$F2 \geq P+P_m,$$

wherein P is a pressure of air filling a gap produced between the first protective member and the conductive member, and $P_m$ is a negative pressure applied to the sensing part.

7. The semiconductor pressure sensor device of claim 6, wherein the first protective member is made of an adhesive material and the second protective member is made of a gel.

8. A semiconductor pressure sensor device comprising:

a package;

a conductive member disposed on a surface of the package;

a sensor chip having a sensing part for detecting a pressure and an electrode part, and mounted on the package at a side opposite to the sensing part with the electrode part electrically connected to the conductive member; and a protective member covering an entire surface of the conductive member in contact with the surface of the package and having a Young's modulus larger than approximately 0.1 MPa.

9. The semiconductor pressure sensor device of claim 8, wherein the protective member includes a first protective member covering the conductive member and having the Young's modulus larger than approximately 0.1 MPa, and a second protective member covering the sensing part of the sensor chip and having a Young's modulus smaller than that of the first protective member.

10. The semiconductor pressure sensor device of claim 9, wherein:

the package is made of resin and having a recess with a bottom face on which the sensor chip is mounted;

the first and second conductive members fills the recess to entirely cover the sensor chip.

11. The semiconductor pressure sensor device of claim 8, wherein the Young's modulus of the first protective member is larger than approximately 0.3 MPa.

12. The semiconductor pressure sensor device of claim 8, wherein the conductive member is covered with a gold layer and the gold layer is covered with the protective member.

13. The semiconductor pressure sensor of claim 1, wherein the resin package has a recess portion having a bottom wall on which the sensor chip is mounted, and an opening portion, an area of which is larger than an area of the bottom wall.

14. The semiconductor pressure sensor of claim 13, wherein the recess portion is tapered from the bottom wall toward the opening portion.

* * * * *